United States Patent [19]

Lemasson

[11] Patent Number: 5,786,726

[45] Date of Patent: Jul. 28, 1998

[54] DEVICE OF THE PHASE-LOCKED LOOP TYPE FOR DEMODULATING A FREQUENCY-MODULATED SIGNAL

[75] Inventor: Pascal Lemasson, Caen, France

[73] Assignee: U.S. Philips Corporation, New York, N.Y.

[21] Appl. No.: 741,166

[22] Filed: Oct. 29, 1996

[30] Foreign Application Priority Data

Oct. 31, 1995 [FR] France .................. 95 12865

[51] Int. Cl.⁶ .................. H03D 3/00; H03B 5/08; H03L 7/099; H03H 11/48
[52] U.S. Cl. .................. 329/325; 329/326; 331/17; 331/23; 331/36 C; 331/175; 331/177 V; 333/214; 348/726; 455/214; 455/337
[58] Field of Search .................. 329/325, 326; 331/17, 23, 36 R, 36 C, 108 D, 117 R, 117 FE, 175, 177 R, 177 V; 348/726, 735; 455/214, 260, 337

[56] References Cited

U.S. PATENT DOCUMENTS 4,612,511  9/1986  Naito et al. .................. 329/124
5,030,927  7/1991  Itoh .................. 331/116 R
5,510,755  4/1996  Kodrnja et al. .................. 331/177 R

FOREIGN PATENT DOCUMENTS

0702452A1  3/1996  European Pat. Off. .
2556526    6/1985  France .
2803400B1  7/1979  Germany .

Primary Examiner—David Mis
Attorney, Agent, or Firm—Michael E. Marion

[57] ABSTRACT

Device of the phase-locked loop type for demodulating a frequency-modulated signal. Device for frequency demodulation, using a phase-locked loop. According to the invention, for linearizing the variation of the frequency of a local oscillator (11) as a function of its control signal (Vb), a variable capacitance (Cv) is formed by an electronic module (20) which supplies the equivalent of a capacitance whose variation as a function of the control voltage (Vb) has a linearity deviation which is established for compensating the linearity deviation of the frequency of the oscillator as a function of the value of the capacitance (Cv).

6 Claims, 3 Drawing Sheets

DEVICE OF THE PHASE-LOCKED LOOP TYPE FOR DEMODULATING A FREQUENCY-MODULATED SIGNAL

BACKGROUND OF THE INVENTION

The invention relates to a device for demodulating a frequency-modulated signal, of the type using a phase-locked loop, comprising an oscillator which supplies an output signal having a frequency which is controllable by means of a control voltage, and a phase comparator having two inputs, one input receiving the signal to be demodulated and the other input receiving the output signal from the oscillator, the output of said phase comparator supplying a signal to filtering means which supply said control voltage for the oscillator, and an output signal for the demodulation device.

Such a device is known, inter alia, from the document FR-A-2 556 526, in which the principle, advantages and drawbacks of this type of circuit are compared with another type of demodulator circuit using a filter and a phase comparator only.

The requirements imposed on the quality of frequency demodulation principally concern the absence of distortion of the demodulated signal. Particularly, strict requirements apply to the demodulation of a television signal, for example a signal transmitted by satellite, because a linearity fault generates intermodulation products between the sound sub-carriers and/or between a sound subcarrier and the chrominance signal. This fault appears in the spectrum of the demodulated video frequency as parasitic rays producing particularly annoying Moiré effects in the image. To avoid this kind of fault, it is necessary that, in the useful range of frequencies used, the derivative of the voltage of the output signal with respect to the frequency of the input signal does not vary by more than ±1%.

Such a linearity performance is achieved with greater difficulty as the deviation of the frequency of the signal to be demodulated is larger. If this deviation is 10%, or more, of the central operating frequency, a demodulation with a weak distortion becomes very difficult due to the fact that the frequency response of the voltage controllable oscillator is not a linear function of its control voltage.

SUMMARY OF THE INVENTION

It is an object of the invention to provide a demodulation device having an improved linearity in a relatively wide range of frequency variations of the input signal, of the order of ±10% of the central frequency of the signal.

According to the invention, the demodulation device is characterized in that the oscillator comprises a resonant circuit of the type formed by a parallel connection of an inductance, a fixed capacitance and a variable capacitance formed by an electronic module coupled to at least a fixed capacitor and supplying the equivalent of a variable capacitance which, as a function of the control voltage applied to said module, has a value featuring a linearity deviation for compensating, in a fixed frequency range, a linearity deviation of the frequency response of the oscillator as a function of the value of the variable capacitance.

The demodulation device according to the invention thus uses an electronic module as a variable capacitance, which value obeys a precise law with respect to the control voltage applied to this module. By providing a non-linear relation between the control voltage and the value of the variable capacitance, the invention enables the frequency response of the oscillator to be made linear as a function of this control voltage in at least a range of frequencies scanned by the frequency-modulated signal. By means of an appropriate control, a practically perfect compensation can be obtained for generating an oscillator frequency which is linear as a function of the control voltage. For lack of a perfect compensation, it is always possible, by means of control, to obtain an inflection point in the frequency response curve of the oscillator as a function of its control voltage, and to place this inflection point in the vicinity of the central frequency of the signal to be demodulated. A very satisfactory compensation of the linearity can be obtained in a useful range of variations around this central frequency.

As a variable capacitance, one of the known circuits based on a coupling with one or several fixed capacitors may be used for supplying the equivalent of a variable capacitance having a value which varies in a precise and reproducible manner with an appropriate control signal.

In accordance with a preferred embodiment of the invention, the device is characterized in that the electronic module comprises an amplifier of the differential output transconductance type and a Gilbert cell symmetrically coupled to two fixed capacitors, and the amplifier is charged at the output by diodes having a voltage which is applied to the inputs of the Gilbert cell.

The use of a Gilbert cell for realizing the equivalent of a variable capacitance provides particular advantages concerning the precision and reproducibility of the results.

The elements constituting this cell can easily be integrated, as well as the fixed capacitors when the frequency of the signal to be demodulated is high enough and this allows the use of capacitors of several pF only. When the capacitors are integrated together with the demodulation device, the implementation of this device is all the more simplified.

To apply the searched linearity correction, a function of the conic type may be used, for example a parabolic function which has a positive growth. However, in a preferred embodiment, the device according to the invention is characterized in that the law for varying the variable capacitance as a function of the control voltage is of the hyperbolic type.

A correction of this type is perfectly adapted for linearizing the frequency response of the oscillator. Moreover, an amplifier which has a hyperbolic transfer function is not only easy to realize in the form of an integrated circuit but also allows the use of a sufficient number of parameters to optimally adapt the realized function to the searched linearity correction.

In accordance with a practical embodiment of the invention, and for realizing a transfer function of the amplifier of the hyperbolic type, the demodulation device is characterized in that the amplifier comprises a differential output stage constituted by a pair of transistors having output electrodes which are connected to said diodes, and reference electrodes which are intercoupled via a linearity resistance and fed by two current sources, in that said amplifier comprises two input stages each receiving said control voltage, a first input stage being of a differential type featuring a substantially linear transfer function, and having outputs which are complementary in voltage and are coupled to the inputs of the output stage, and a second input stage also featuring a substantially linear transfer function, and having a single voltage output which supplies a command which is proportional to the current supplied by the two current sources feeding the output stage.

Moreover, the first and the second input stage of the amplifier each provide a predetermined offset voltage.

3

In accordance with this embodiment, there are four control parameters for realizing the optimally adapted transfer function, parameters among which only three are really independent.

The invention also relates to an apparatus for receiving television signals, for example an apparatus for decoding satellite signals, and is characterized in that it comprises a demodulation device according to the invention and as described hereinbefore.

These and other aspects of the invention will be apparent from and elucidated with reference to the embodiments described hereinafter.

BRIEF DESCRIPTION OF THE DRAWING

In the drawings:

FIG. 2 shows capacitance and frequency curves as a function of a control voltage in the case where correction is applied to this control voltage, whereas

DETAILED DESCRIPTION OF THE PREFERRED EMBODIMENTS

Figure 1:
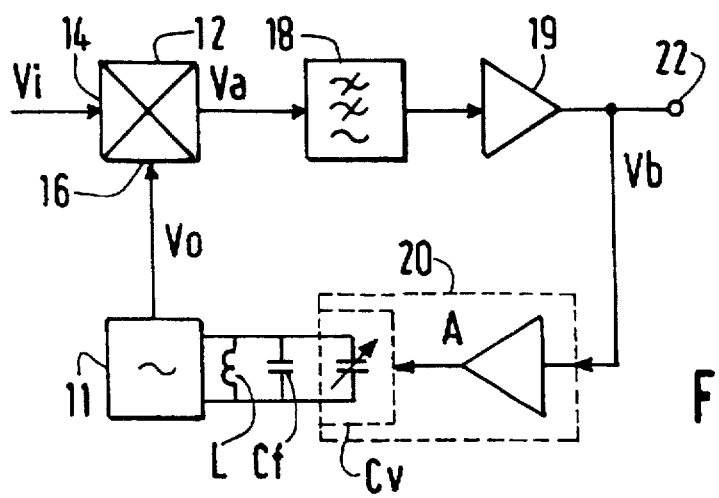
FIG. 1 is a general circuit diagram of a demodulation device of the phase-locked loop type, with reference to which the principle of the invention will be described.

FIG. 1 shows diagrammatically a device of the phase-locked loop type for demodulating a frequency-modulated signal. This device comprises an oscillator 11 which supplies an output signal Vo, a phase comparator 12 having two inputs, one input 14 receiving a signal Vi to be demodulated and one input 16 receiving the signal Vo from the oscillator 11. The oscillator 11 comprises a -resonant circuit of the type constituted by a parallel connection of an inductance L, a fixed capacitance Cf and a variable capacitance Cv which is implemented by means of an electronic module 20 supplying the equivalent of a variable capacitance as a function of a control voltage Vb applied to said module 20.

The control voltage Vb of the oscillator 11 is applied to an output terminal 22 of the demodulation device. This voltage Vb is deduced from a voltage Va obtained at the output of the phase comparator 12 after filtering in a low-pass filter 18 which ensures the stability of the phase-locked loop, and after amplification in an amplifier 19.

According to the invention, to obtain a good linearity between the control signal Vb and the frequency of the output signal Vo of the oscillator 1, the value of the variable capacitance Cv as a function of the control voltage Vb which is applied to the module 20 features a linearity deviation which is chosen for compensating, in the relevant range of frequencies, a linearity deviation of the frequency response of the oscillator 11 as a function of the value of this variable capacitance Cv.

Figure 2:
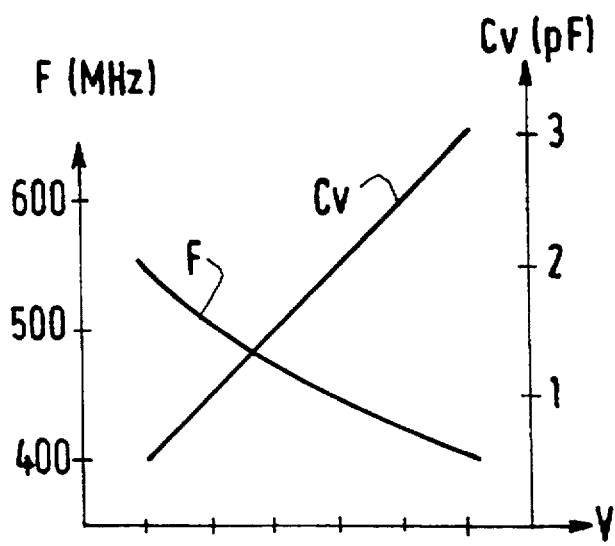

A linearity fault of the frequency response of the oscillator 11 is shown in FIG. 2. It has been supposed that a variable capacitance Cv varies linearly as a function of the control voltage Vb, plotted on the abscissa. In the example, this capacitance Cv varies from 0.5 to 3 pF and is connected in parallel with a fixed capacitance of approximately 2.5 pF.

4

The frequency F obtained by the oscillator 11 varies between 550 and 410 MHz. The curve F of the frequency has a function which deviates from a straight line and is slightly curved.

Figure 3:
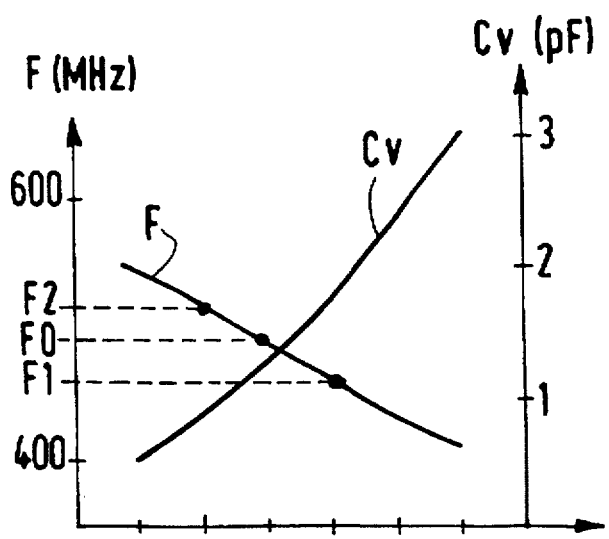
FIG. 3 shows analog curves obtained in accordance with the invention.

FIG. 3 shows the effect obtained according to the invention by the electronic module 20 for non-linear correction. According to the invention, the curve Cv of the variable capacitance as a function of the control voltage Vb has a linearity deviation as compared with the corresponding curve of FIG. 2. This deviation is determined in order that the curve representing the frequency curve F of the oscillator becomes linear, at least in a frequency range F1–F2 around a central frequency FO.

An electronic module such as the module 20 in FIG. 1 may be implemented in different manners. It is based on the use of at least one capacitor of fixed value which, incorporated in this module, provides an effect which is equivalent to that of a variable capacitance. It comprises a transistor amplifier A controlling the variation of the equivalent variable capacitance in accordance with a non-linear function with respect to the voltage Vb applied to the input of this amplifier A.

Figure 4:
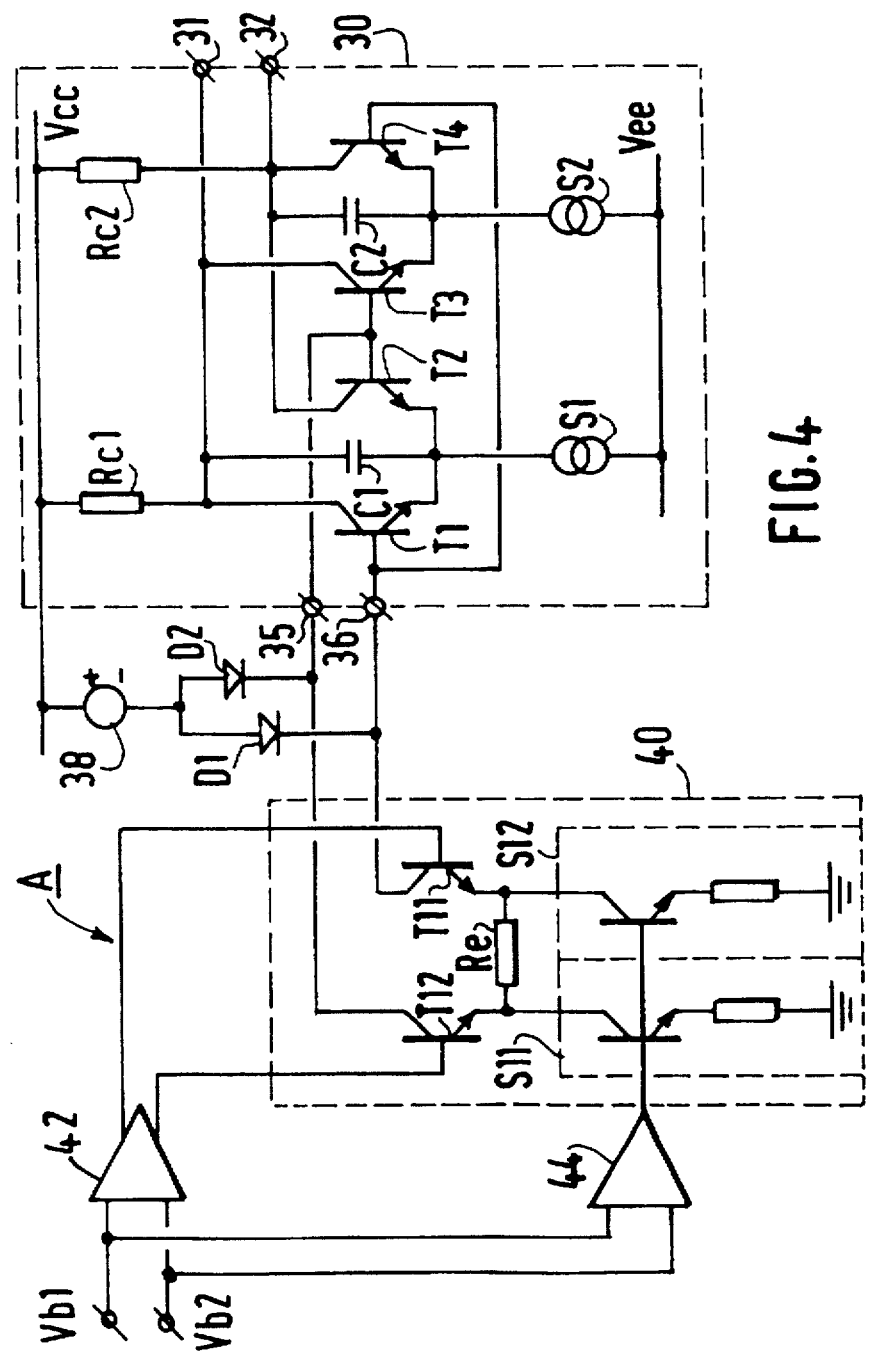
FIG. 4 shows the electric circuit diagram of a Gilbert cell circuit equivalent variable capacitance, and an amplifier introducing a non-linear correction of a control signal of this variable capacitance.

FIG. 4 shows a detailed electric circuit diagram of an embodiment of an electronic module such as the module 20 shown in FIG. 1.

In this embodiment, the variable capacitance is implemented by means of a Gilbert cell 30 composed of transistor pairs T1–T2, T3–T4 whose combined emitters in each pair are fed by the current source S1 and the current source S2, respectively. The collector of transistor T1 is connected to the collector of transistor T3, while the assembly is coupled to a supply line Vcc by means of a load resistance Rc1. In a symmetrical manner, the collector of transistor T2 is connected to the collector of transistor T4, while the assembly is coupled to the line Vcc by means of a load resistance Rc2.

The combined bases of transistors T2 and T3 are connected to a first input terminal 35 of the Gilbert cell, while the combined bases of the transistors T1 and T4 are connected to a second input terminal 36. A fixed capacitor C1 connects the collector of transistor T1 to its emitter and another fixed capacitor C2 connects the collector of the transistor T4 to its emitter.

The Gilbert cell 30 is controlled by an amplifier A supplying a load at the output, which load is constituted by diodes D1, D2 whose combined anodes are coupled to the supply line Vcc via an offset voltage device 38.

The amplifier A is of the transconductance type and has a differential output stage constituted by a pair of transistors T11, T12 whose collectors are connected to the cathodes of the diodes D1 and D2 and to the input terminals 35 and 36, respectively, of the Gilbert cell 30.

The emitters of transistors T1 and T12 are coupled by means of an emitter resistor Re and are each fed by a current source S11, S12, respectively, which can supply a variable current which remains identical between the two current sources.

The amplifier A also comprises two input stages, a first stage 42 of the differential type having a substantially linear transfer function, and outputs which are coupled to the bases of transistors T11 and T12, and a second input stage 44 of the differential type having a substantially linear transfer function and a single output which controls the bases of the transistors constituting the current sources S11 and S12, respectively, and thus realizes the current control of these current sources.

Input stages 42 and 44 receive, in parallel, input voltages Vb1 and Vb2 representing, in a differential form, the control voltage Vb as mentioned in FIG. 1.

The two input stages 42 and 44 each have a given offset voltage. The input stage 44 has such an offset voltage that, for a signal Vb=Vb1−Vb2=0, the current sources S11 and S12 supply a quiescent current Ir, while for an input voltage Vb1−Vb2 different from zero, the current Iee of the current sources S11 and S12 has the form of Iee =Ir+k1.Vb. The input stage 42 has such an offset voltage that, for an input voltage Vb1−Vb2 of zero, the transistor T11 supplies a higher current than the current supplied by the transistor T12.

When ignoring the base currents, the collector current Ic11 of the transistor T1 1 can be written in the form of $$Ic11 = k2.(Vb + \Delta V)/Re + Iee \quad (1)$$

$$\text{with } Iee = k1.Vb + Ir \quad (2)$$

i.e. a linear form with respect to Vb, in which expressions, k2 is a coefficient related to the gain of the first input stage 42 and ΔV is the offset voltage of this stage.

In another connection, one has:

$$Ic11 + Ic12 = 2.Iee = 2.(k1.Vb + Ir) \quad (3)$$

i.e. the sum of the collector currents of the transistors T11 and T12 is equal to the sum of the currents of the sources S11 and S12.

The voltage difference (VD1−VD2) at the terminals of the diodes D1 and D2 can be written as:

$$VD1 - VD2 = V_T Ln(Ic11/Ic12) \quad (4)$$

with $V_T = mV$ at 300° K.

This voltage difference, applied to the input terminals of the Gilbert cell 30, gives rise to the fact that the collector currents Ic1 and Ic2 in the transistors T1 and T2 are defined by $$VD1 - VD2 = VT\ Ln(Ic2/I1) \quad (5)$$

It follows from a comparison between (4) and (5) that:

$$\frac{Ic2}{Ic1} = \frac{Ic11}{Ic12}$$

or, by using the relations (1), (2) and (3)

$$\frac{Ic2}{Ic1 + Ic2} = \frac{Ic11}{Ic11 + Ic12} = \frac{k1 Vb + Ir + k2 \cdot Vb/Re + k2\Delta V/Re}{2k1 \cdot Vb + 2Ir} \quad (6)$$

$$Ic2 = (Ic1 + Ic2) \cdot \frac{(k1 + k2/Re) \cdot Vb + k2\Delta V/Re + Ir}{2k1 \cdot Vb + 2Ir}$$

Relation (6) shows that Ic2 is of the hyperbolic form:

$$\frac{aVb + b}{cVb + d}$$

and may be adjusted by means of three independent parameters so as to optimally adapt them to the searched form of the curve.

In the example shown in FIG. 4, one may arbitrarily choose the gain of the first input stage 42, the gain of the second input stage 44, the offset voltages of each of these input stages.

Figure 5:
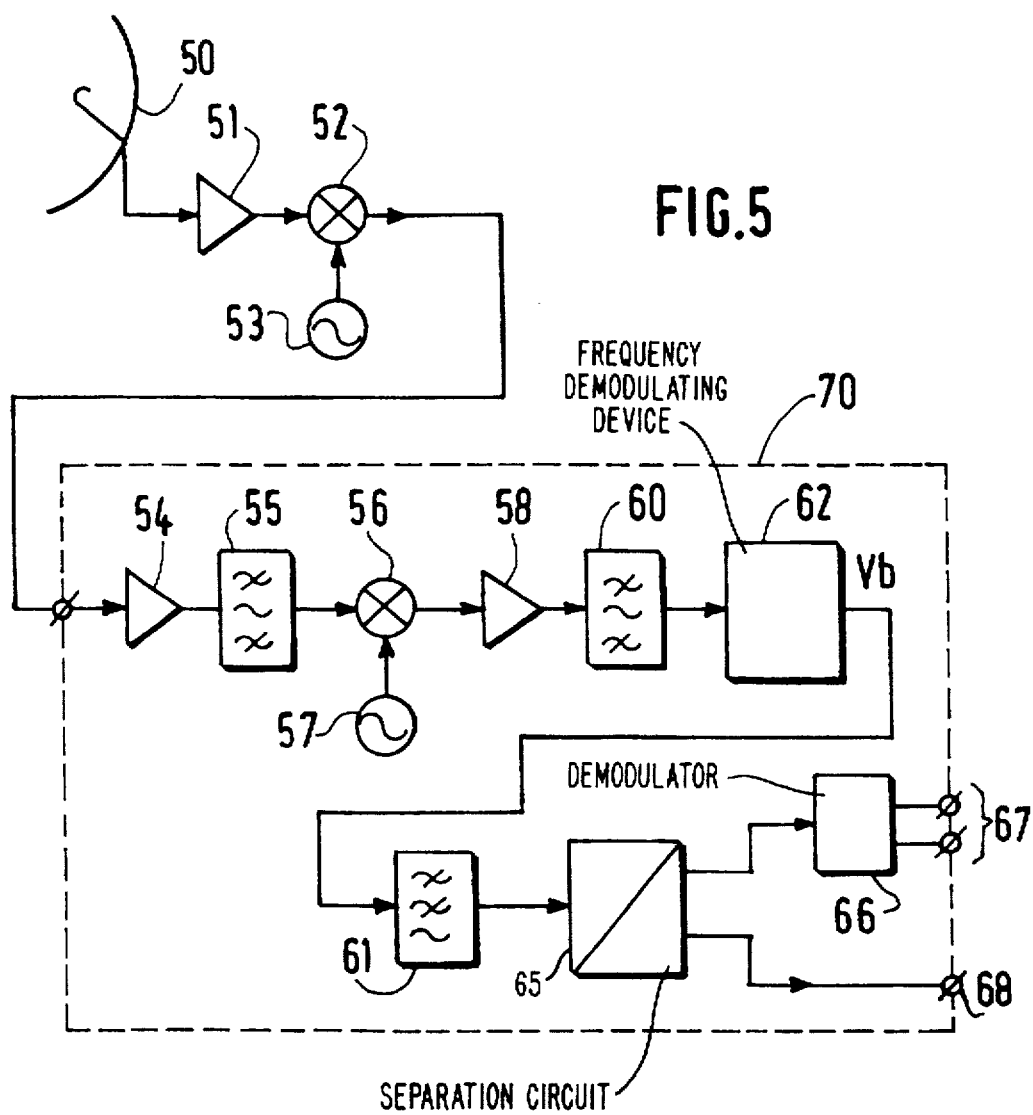
FIG. 5 shows a simplified circuit of a receiver incorporating a frequency modulation circuit according to the invention.

FIG. 5 is a block diagram of an example of a receiver incorporating a demodulation device as described hereinbefore. A parabolic reflector antenna 50 receives satellite signals transmitted at a frequency of 10 to 12 GHz. After amplification in an antenna amplifier 51, the signals received are applied to a first mixer 52 receiving also the signal from a first oscillator 53 having a frequency which is chosen to supply, at the output of this first mixer 52, a range of frequencies between 920 and 2,150 MHz. The elements 51, 52 and 53 are located at the level of the antenna 50 and are shown separately, only for the purpose of better clarity of the Figure.

The receiver referred to is bounded by a square 70 shown in a broken line. It comprises an input amplifier 54, followed by a bandpass filter 55 ensuring a preselection of the channels to be received. At the output of this filter 55, the signal is again combined in a second mixer 56 with the signal produced by a second oscillator 57 so as to produce a signal at an intermediate frequency of the order of 480 MHz.

The IF signal is amplified in an amplifier 58 having an automatic gain control, then filtered in a bandpass filter 60 and applied to the input of a frequency demodulation device 62 in accordance with the invention. It supplies an output voltage Vb representing the demodulated reception signal. By means of the demodulation device according to the invention, it is possible to, obtain a frequency response having an excellent linearity, corresponding to a value of intermodulation products of −55 dBc for the second order and of −60 dBc for the third order.

The composite video signal Vb is processed in a de-emphasis filter 64 at whose output a separation circuit 65 extracts the sound signals which are demodulated in a demodulator 66 and available at the output 67 of the apparatus, while the picture signals composed of luminance signals and chrominance signals are applied to an output 68.

The receiver, which has been concisely described by way of example for the purpose of illustrating the invention, may have a slightly different set-up without departing from the scope of the invention. Modifications in this respect are known to those skilled in the art.

I claim:

1. A device for demodulating a frequency-modulated signal, of the type using a phase-locked loop, comprising an oscillator which supplies an output signal having a frequency which is controllable by means of a control voltage, and a phase comparator having two inputs, one input receiving the signal to be demodulated and the other input receiving the output signal from the oscillator, the output of said phase comparator supplying a signal to filtering means which supply said control voltage for the oscillator, and an output signal for the demodulation device, wherein the oscillator comprises a resonant circuit of the type formed by a parallel connection of an inductance, a fixed capacitance and a variable capacitance formed by an electronic module wherein the value of said variable capacitance varies as a non-linear function of the control voltage applied to said module, and said value features a linearity deviation for compensating, in a fixed frequency range, a linearity deviation of the frequency response of the oscillator as a function of the value of said variable capacitance.

2. A demodulation device as claimed in claim 1, characterized in that the electronic module comprises an amplifier of the differential output transconductance type and a Gilbert cell symmetrically coupled to two fixed capacitors, and the amplifier is charged at the output by diodes having a voltage which is applied to the inputs of the Gilbert cell.

3. A demodulation device as claimed in claim 2, characterized in that the the capacitance of the variable capacitance varies hyperbolically as a function of the control voltage.

4. A demodulation device as claimed in claim 3, characterized in that the amplifier comprises a differential output stage constituted by a pair of transistors having output electrodes which are connected to said diodes, and reference electrodes which are intercoupled via a linearity resistance and fed by two current sources, in that said amplifier comprises two input stages each receiving said control voltage, a first input stage being of a differential type featuring a substantially linear transfer function, and having outputs which are complementary in voltage and are coupled to the inputs of the output stage, and a second input stage also featuring a substantially linear transfer function, and having a single voltage output which supplies a command which is proportional to the current supplied by the two current sources feeding the output stage.

5. A demodulation device as claimed in claim 4, characterized in that the first and the second input stage of the amplifier each provide a predetermined offset voltage.

6. An apparatus for receiving television signals, characterized in that it comprises a demodulation device for demodulating a frequency-modulated signal of the type using a phase-locked loop, comprising an oscillator which supplies an output signal having a frequency which is controllable by means of a control voltage, and a phase comparator having two inputs, one input receiving the signal to be demodulated and the other input receiving the output signal from the oscillator, the output of said phase comparator supplying a signal to filtering means which supply said control voltage for the oscillator, and an output signal for the demodulation device, wherein the oscillator comprises a resonant circuit of the type formed by a parallel connection of an inductance, a fixed capacitance and a variable capacitance formed by an electronic module, wherein the value of said variable capacitance varies as a non-linear function of the control voltage applied to said module, and said value features a linearity deviation for compensating, in a fixed frequency range, a linearity deviation of the frequency response of the oscillator as a function of the value of said variable capacitance.

* * * * *